United States Patent
Liu et al.

(10) Patent No.: US 11,757,044 B2
(45) Date of Patent: Sep. 12, 2023

(54) ELECTRODE STRUCTURE, MANUFACTURING METHOD THEREOF, AND THIN FILM TRANSISTOR

(71) Applicant: TCL China Star Optoelectronics Technology Co., Ltd., Guangdong (CN)

(72) Inventors: Wenbo Liu, Guangdong (CN); Yuanke Huang, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 384 days.

(21) Appl. No.: 17/255,445

(22) PCT Filed: Dec. 18, 2020

(86) PCT No.: PCT/CN2020/137668
§ 371 (c)(1),
(2) Date: Dec. 23, 2020

(87) PCT Pub. No.: WO2022/110394
PCT Pub. Date: Jun. 2, 2022

(65) Prior Publication Data
US 2022/0352381 A1    Nov. 3, 2022

(30) Foreign Application Priority Data
Nov. 27, 2020   (CN) .......................... 202011361178.0

(51) Int. Cl.
*H01L 29/786*    (2006.01)
*G02F 1/1368*    (2006.01)
(Continued)

(52) U.S. Cl.
CPC ...... *H01L 29/78633* (2013.01); *G02F 1/1368* (2013.01); *G02F 1/136209* (2013.01);
(Continued)

(58) Field of Classification Search
CPC ......... H01L 29/78633; H01L 29/41733; H01L 29/42384; G02F 1/136209; G02F 1/1368
See application file for complete search history.

(56) References Cited

U.S. PATENT DOCUMENTS 6,844,215 B1    1/2005   Ghosh
10,802,361 B2   10/2020  Deng
(Continued)

FOREIGN PATENT DOCUMENTS

CN    1541032      10/2004
CN    101595568    12/2009
(Continued)

*Primary Examiner* — Joseph C. Nicely

(57) ABSTRACT

An electrode structure is disclosed, which includes a buffer layer disposed on a substrate; and an electrode disposed on a surface of the buffer layer away from the substrate, an edge of the electrode including an extension surface extending from a surface of the electrode away from the substrate, and the extension surface is in contact with a surface of the buffer layer and forms an included angle with a surface of the buffer layer contacting the electrode. An anti-reflection layer is disposed at the edge of the electrode, the anti-reflection layer surrounds and covers the edge of the electrode, and the anti-reflection layer extends to be in contact with the buffer layer. An undercut structure is formed between an outer surface of the anti-reflection layer and the surface of the buffer layer.

16 Claims, 3 Drawing Sheets

(51) Int. Cl.
  *H01L 29/40*    (2006.01)
  *G02F 1/1362*   (2006.01)
  *H01L 29/417*   (2006.01)
  *H01L 29/423*   (2006.01)
  *H01L 29/45*    (2006.01)
  *H01L 29/49*    (2006.01)

(52) U.S. Cl.
  CPC ...... *H01L 29/401* (2013.01); *H01L 29/41733* (2013.01); *H01L 29/42384* (2013.01); *H01L 29/45* (2013.01); *H01L 29/458* (2013.01); *H01L 29/4908* (2013.01)

(56) References Cited

U.S. PATENT DOCUMENTS

| | | | |
|---|---|---|---|
| 2009/0214839 A1* | 8/2009 | Kotsubo | H05K 9/0096 428/209 |
| 2012/0154728 A1 | 6/2012 | Oh et al. | |
| 2015/0177876 A1* | 6/2015 | Ishii | G06F 3/0445 345/174 |
| 2015/0357388 A1 | 12/2015 | Pang | |
| 2017/0017335 A1* | 1/2017 | Takahashi | G06F 3/0445 |
| 2018/0101258 A1* | 4/2018 | Cho | G06F 3/041 |
| 2018/0120971 A1* | 5/2018 | Lee | G06F 3/0446 |
| 2020/0335609 A1 | 10/2020 | Nakazawa et al. | |

FOREIGN PATENT DOCUMENTS

| | | |
|---|---|---|
| CN | 102629609 | 8/2012 |
| CN | 103309154 | 9/2013 |
| CN | 103325811 | 9/2013 |
| CN | 103488001 | 1/2014 |
| CN | 103915508 | 7/2014 |
| CN | 104733539 | 6/2015 |
| CN | 105374748 | 3/2016 |
| CN | 106201079 | 12/2016 |
| CN | 106501988 | 3/2017 |
| CN | 107015410 | 8/2017 |
| CN | 107195634 | 9/2017 |
| CN | 107683453 | 2/2018 |
| CN | 110082975 | 8/2018 |
| CN | 108573956 | 9/2018 |
| CN | 108873519 | 11/2018 |
| CN | 109004032 | 12/2018 |
| CN | 109599501 | 4/2019 |
| CN | 110828481 | 2/2020 |
| CN | 211957649 | 11/2020 |
| EP | 3070521 | 9/2016 |
| EP | 3739631 | 11/2020 |
| JP | 5151337 | 2/2013 |
| WO | WO 81/00463 | 2/1981 |

* cited by examiner

US 11,757,044 B2

ELECTRODE STRUCTURE, MANUFACTURING METHOD THEREOF, AND THIN FILM TRANSISTOR

RELATED APPLICATIONS

This application is a National Phase of PCT Patent Application No. PCT/CN2020/137668 having International filing date of Dec. 18, 2020, which claims the benefit of priority of Chinese Patent Application No. 202011361178.0 filed on Nov. 27, 2020. The contents of the above applications are all incorporated by reference as if fully set forth herein in their entirety.

FIELD AND BACKGROUND OF THE INVENTION

The present application relates to the field of display technologies, in particular to an electrode structure, a manufacturing method thereof, and a thin film transistor.

With continuous development of production technologies of liquid crystal display devices, the liquid crystal display devices are gradually becoming narrower in bezel or even borderless. Design of borderless display products requires that a thin film transistor (TFT) side faces outwardly for flexible printed circuit (FPC) bonding. When the thin film transistor side faces outwardly, metal positioned in a thin film transistor region is not blocked by a black matrix (BM), which causes a reflectivity of a display panel to ambient light to increase significantly. Generally, a black metal layer (MoOx) is introduced under a first metal electrode layer M1 as a buffer layer to reduce the reflectivity of ambient light.

However, when the thin film transistor side faces outwardly, since an undercut angle (taper angle, cone angle) of the metal electrode after etching faces a side of a backlight, taking a copper electrode as an example, in a dark state, the backlight illuminates on the undercut angle of the copper electrode, reflection occurs, causing light leakage and seriously affecting a contrast ratio of the products.

SUMMARY OF THE INVENTION

Technical Problem

The present application provides an electrode structure, a manufacturing method thereof, and a thin film transistor. By forming an electrode on a buffer layer, an edge of the electrode having an extension surface, an anti-reflection layer disposed at the edge of the electrode, the anti-reflection layer covering the extension surface, and an undercut structure formed between an outer surface of the anti-reflection layer away from the electrode and a surface of the buffer layer contacting the electrode. In products with a thin film transistor side facing outwardly, the anti-reflection layer is configured to reduce a reflectivity and to eliminate a problem of light leakage of the products with the thin film transistor side facing outwardly in a dark state.

Technical Solutions

In a first aspect, an embodiment of the present application provides an electrode structure, including at least one buffer layer disposed on a substrate; at least one electrode disposed on a surface of the buffer layer away from the substrate, an edge of the electrode including at least one extension surface extending from a surface of the electrode away from the substrate, wherein the extension surface is in contact with a surface of the buffer layer contacting the electrode and forms an included angle with the surface of the buffer layer contacting the electrode; an anti-reflection layer disposed at the edge of the electrode, wherein the anti-reflection layer is configured to surround and cover the edge of the electrode, and the anti-reflection layer extends to be in contact with the buffer layer; and, an undercut structure formed between an outer surface of the anti-reflection layer away from the electrode and the surface of the buffer layer contacting the electrode; wherein the anti-reflection layer is configured to cover the extension surface, and the outer surface of the anti-reflection layer away from the extension surface and the surface of the buffer layer contacting the electrode are configured to form the undercut structure.

In the said electrode structure, a cross-sectional area of the electrode away from the substrate is less than or equal to a cross-sectional area of the electrode close to the substrate in a direction perpendicular to the substrate.

In the said electrode structure, a material of the anti-reflection layer is metal oxide.

In the said electrode structure, a material of the anti-reflection layer is an oxide of material of the electrode.

In the said electrode structure, a material of the electrode is copper or silver, and a material of the anti-reflection layer is copper oxide or silver oxide.

In the said electrode structure, a material of the buffer layer is molybdenum oxide.

In a second aspect, an embodiment of the present application further provides a thin film transistor including an electrode structure, wherein the electrode structure includes at least one buffer layer disposed on a substrate; at least one electrode disposed on a surface of the buffer layer away from the substrate; an anti-reflection layer disposed at an edge of the electrode, wherein the anti-reflection layer is configured to surround and cover the edge of the electrode, and the anti-reflection layer extends to be in contact with the buffer layer; and, an undercut structure formed between an outer surface of the anti-reflection layer away from the electrode and a surface of the buffer layer contacting the electrode.

In the said thin film transistor, the edge of the electrode includes at least one extension surface extending from a surface of the electrode away from the substrate, and the extension surface is in contact with the surface of the buffer layer contacting the electrode and forms an included angle with the surface of the buffer layer contacting the electrode.

In the said thin film transistor, a cross-sectional area of the electrode away from the substrate is less than or equal to a cross-sectional area of the electrode close to the substrate in a direction perpendicular to the substrate.

In the said thin film transistor, the anti-reflection layer is configured to cover the extension surface, and the outer surface of the anti-reflection layer away from the extension surface and the surface of the buffer layer contacting the electrode are configured to form the undercut structure.

In the said thin film transistor, a material of the anti-reflection layer is a metal oxide.

In the said thin film transistor, a material of the anti-reflection layer is an oxide of material of the electrode.

In the said thin film transistor, a material of the electrode is copper or silver, and material of the anti-reflection layer is copper oxide or silver oxide.

In the said thin film transistor, a material of the buffer layer is molybdenum oxide.

In a third aspect, an embodiment of the present application further provides a manufacturing method of an electrode structure, including following steps:

forming a buffer layer and a metal layer stacked on a substrate sequentially;

forming a photoresist layer on the metal layer, and patterning the buffer layer and the metal layer to obtain a patterned buffer layer and an electrode; and, forming an anti-reflection layer on a surface of the electrode before peeling off the photoresist layer.

In the said manufacturing method, step of forming the anti-reflection layer on the surface of the electrode includes:

oxidizing an exposed surface of the electrode with extreme ultraviolet in an oxidizing gas environment to form the anti-reflection layer.

Beneficial Effect

Compared with the conventional art, in the electrode structure, the manufacturing method thereof, and the thin film transistor provided by the present application, at least one electrode is disposed on the buffer layer, and the anti-reflection layer is disposed at the edge of the electrode. The anti-reflection layer is configured to surround and cover the edge of the electrode, and the anti-reflection layer extends to be in contact with the buffer layer. The undercut structure is formed between the outer surface of the anti-reflection layer away from the electrode and the surface of the buffer layer contacting the electrode. In addition, the present application further provides a specific embodiment, by providing at least one extension surface in an edge region of the side of the electrode away from the surface of the buffer layer, the extension surface forms an included angle with the surface of the buffer layer contacting the electrode. The anti-reflection layer is disposed on the extension surface and covers the extension surface, and the material of the anti-reflection layer is metal oxide. In products with the thin film transistor side facing outwardly, the anti-reflection layer is configured to reduce the reflectivity and to eliminate the problem of light leakage of the products with the thin film transistor side facing outwardly in the dark state.

DESCRIPTION OF SPECIFIC EMBODIMENTS OF THE INVENTION

The application provides an electrode structure, a manufacturing method thereof, and a thin film transistor. In order to illustrate the technical solutions of the present application or the related art in a clearer manner, the drawings desired for the present application or the related art will be described hereinafter briefly. It should be understood that the specific embodiments described here are only used to explain the application, and not used to limit the application.

Figure 1:
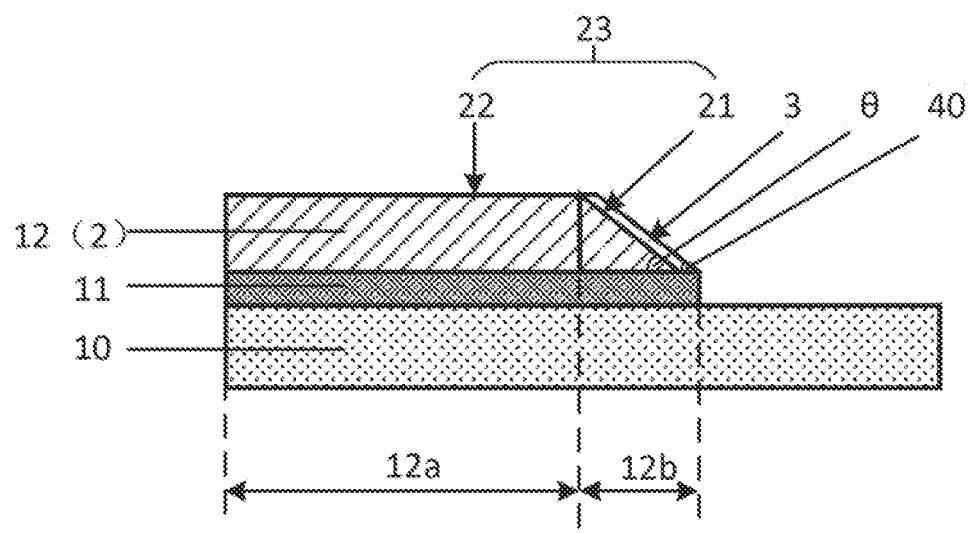
FIG. 1 is a schematic structural diagram of an electrode structure in the present application.

Refer to FIG. 1, which is a schematic structural diagram of the electrode structure in the present application. In the present application, as shown in FIG. 1, the electrode structure includes at least one buffer layer 1 and at least one electrode 2. The buffer layer 1 is disposed on a substrate 10, and the electrode 2 is disposed on a surface of the buffer layer 1 away from the substrate 10. In an embodiment of the present application, an anti-reflection layer 3 is disposed at an edge of the electrode 2, and the anti-reflection layer 3 is configured to surround the edge of the electrode 2 and cover the edge of the electrode 2. The anti-reflection layer 3 extends to be in contact with the buffer layer 1. As shown in FIG. 1, an outer surface of the anti-reflection layer 3 away from the electrode 2 is in contact with a surface of the electrode 2 that contacts the buffer layer 1, and an undercut structure 40 is formed between the outer surface of the anti-reflection layer 3 away from the electrode 2 and a surface of the buffer layer 1 contacting the electrode 2.

In the present embodiment, as shown in FIG. 1, in an extending direction of the substrate 10, the electrode 2 has a central region 12a and at least one edge region 12b arranged surrounding the central region 12a. The electrode 2 further has a continuous first surface 23 extending from the central region 12a to the edge region 12b. In the edge region 12b, the first surface 23 further includes an extension surface 21, which is a surface formed by the first surface 23 deviating from the central region 12a. The surface of the first surface 23 excluding the extension surface 21 is a second surface 22. That is, the extension surface 21 is formed on both sides of the second surface 22. When the extension surface 21 extends from the central region 12a to the edge region 12b, the extension surface 21 extends to form an included angle θ with the surface of the buffer layer 1 contacting the electrode 2. That is, the edge region 12b of the electrode 2 has a taper. In the present embodiment, a thickness of the electrode 2 in the edge region 12b is less than a thickness of the electrode 2 in the central region 12a.

In the present application, the extension surface 21 is preferably an inclined surface, and the inclined surface is an inclined plane.

In the present application, the anti-reflection layer 3 is configured to cover the extension surface 21, that is, the anti-reflection layer 3 is disposed on the inclined surface and covers the inclined surface. The undercut structure 40 is formed between the outer surface of the anti-reflection layer 3 away from the electrode 2 and the surface of the buffer layer 1 contacting the electrode 2. In the present embodiment, an angle of the undercut structure 40 is equal to the included angle θ.

A further preferred embodiment is that the outer surface of the anti-reflection layer 3 away from the extension surface 21 of the electrode 2 is an inclined plane. A thickness of the anti-reflection layer 3 is defined in a direction perpendicular to the extension surface 21, and the thickness of the anti-reflection layer 3 is same in an extension direction of the extension surface 21. Equivalently, in a direction perpendicular to the substrate 10, a cross-sectional area of a side of the electrode 2 away from the substrate 10 is less than or equal to a cross-sectional area of a side of the electrode 2 close to the substrate 10.

In the present application, material of the buffer layer 1 is black metal, and the material of the buffer layer 1 is preferably molybdenum oxide. In the present application, the buffer layer 1 serves as a barrier layer, and the buffer layer 1 is configured to initially reduce a reflectivity of the electrode 2 to ambient light.

In an embodiment of the present application, material of the electrode 2 is preferably copper, and material of the anti-reflection layer 3 is an oxide of the electrode 2, that is, the material of the anti-reflection layer 3 is black copper oxide. In some other preferred embodiments, the material of the electrode 2 can also be silver, and the material of the anti-reflection layer 3 is silver oxide. Wherein, the anti-reflection layer 3 covers the extension surface 21 of the electrode 2, and the anti-reflection layer 3 is configured to further reduce the reflectivity of the electrode 2 to ambient light.

The present application further provides a thin film transistor including a gate, an active layer, a source, and a drain, and the thin film transistor further includes the electrode structure as described above.

Figure 2:
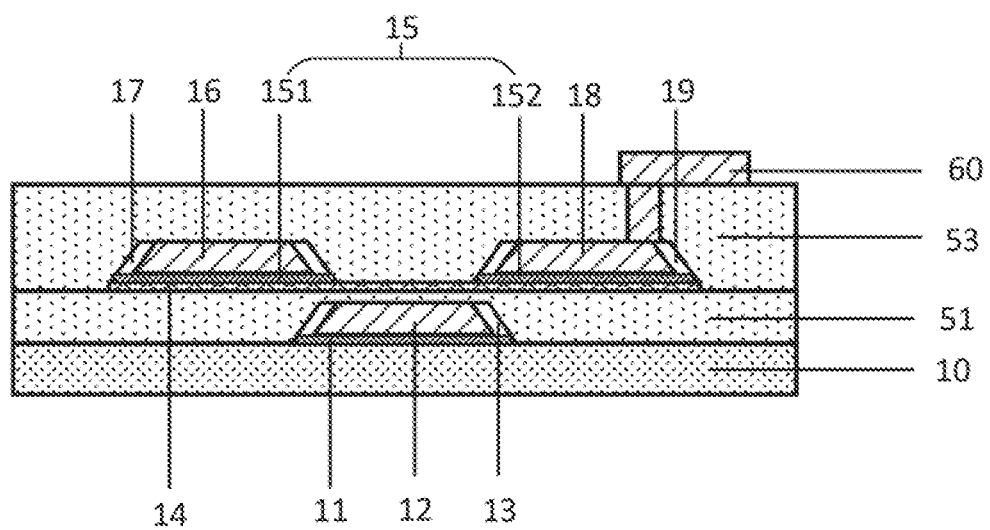
FIG. 2 is a schematic structural diagram of a thin film transistor in the present application.

Refer to FIG. 2, which is a schematic structural diagram of the thin film transistor in the present application. In an embodiment of the present application, the thin film transistor includes a first buffer layer 11, a gate 12, a first anti-reflection layer 13, an active layer 14, a second buffer layer 15, a source 16, a second anti-reflection layer 17, a drain 18, and a third anti-reflection layer 19.

Specifically, the first buffer layer 11 of the thin film transistor is disposed on the substrate 10. The gate 12 and the first anti-reflection layer 13 are disposed on a surface of the first buffer layer 11 away from the substrate 10, the first anti-reflection layer 13 is disposed surrounding an edge of the gate 12 and covering the edge of the gate, and the first anti-reflection layer 13 extends to contact and connect to the first buffer layer 11. The active layer 14 is disposed on the gate 12 and a side of the first anti-reflection layer 13 away from the substrate 10. The second buffer layer 15 is disposed on the active layer 14. The second buffer layer 15 includes a first portion 151 and a second portion 152 that are disconnected from each other. The source 16 and the second anti-reflection layer 17 are disposed on the first portion 151, the first anti-reflection layer 13 is disposed surrounding the edge of the gate 12 and covering the edge of the gate, and extends to be in contact with the first buffer layer 11. The drain 18 and the third anti-reflection layer 19 are disposed on the second portion 152, the third anti-reflection layer 19 is disposed surrounding an edge of the drain 18 and covering the edge of the drain, and the third anti-reflection layer 19 extends to be in contact with the second buffer layer 15.

As shown in FIG. 2, in an embodiment of the present application, the thin film transistor preferably includes a plurality of interlayer insulating layers, and the interlayer insulating layers include but are not limited to the first buffer layer 11, the second buffer layer 15, a gate insulating layer 51, and a passivation layer 53.

Specifically, in the present embodiment, the gate insulating layer 51 is disposed on the gate 12 and the first anti-reflection layer 13, and the gate insulating layer 51 covers the gate 12, the first anti-reflection layer 13, the first buffer layer 11, and the substrate 10. The active layer 14 of the thin film transistor is disposed on the gate insulating layer 51. The passivation layer 53 is disposed on the source 16 and the drain 18, and the passivation layer 53 covers the source 16, the second anti-reflection layer 17, the drain 18, the third anti-reflection layer 19, the second buffer layer 15, the active layer 14, and the gate insulating layer 51.

A manufacturing method of the electrode structure in the present embodiment will be described in detail below with reference to FIGS. 1 to 6. The manufacturing method includes step S01, step S02, step S03, and step S04. Step S03 includes step S31 and step S32. Steps S01 to S04 are described as follows.

Figure 3:
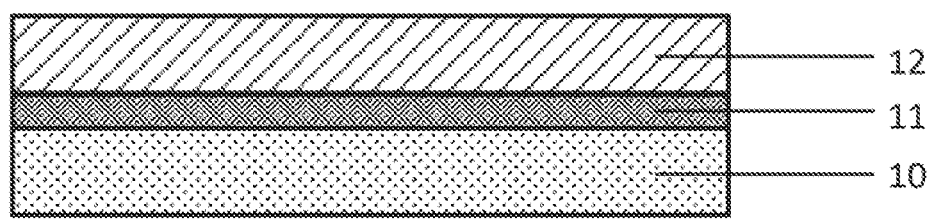
FIGS. 3, 4, 5, and 6 are flowcharts of a manufacturing method of the electrode structure in the present application.

Step S01: forming a first buffer layer 11 and a first metal layer stacked on a substrate 10 sequentially, as shown in FIG. 3.

In this step, the substrate 10 is provided, and the first buffer layer 11 and the first metal layer are sequentially deposited on the substrate 10, and the first metal layer is formed on a side of the first buffer layer 11 away from the substrate 10.

In the present embodiment, material of the first metal layer is copper or silver.

In the present embodiment, material of the first buffer layer 11 is black metal, and the material of the first buffer layer 11 is preferably molybdenum oxide.

In the present application, a thickness of the first buffer layer 11 and the first metal layer is not limited.

In the present embodiment, the substrate 10 includes but is not limited to a glass substrate.

Step S02: forming a photoresist layer 20 on the first metal layer, and patterning the first buffer layer 11 and the first metal layer to obtain a patterned first buffer layer 11 and an electrode 12.

In this step, a photoresist material is coated on a surface of the first metal layer away from the first buffer layer 11 to form a photoresist layer 20, and a photomask (or a mask) is configured to perform a photolithography treatment on the photoresist layer, that is, performing exposure and development, and then the first buffer layer 11 and the first metal layer are patterned through an etching process to obtain the patterned first buffer layer 11 and the electrode 12.

Figure 4:
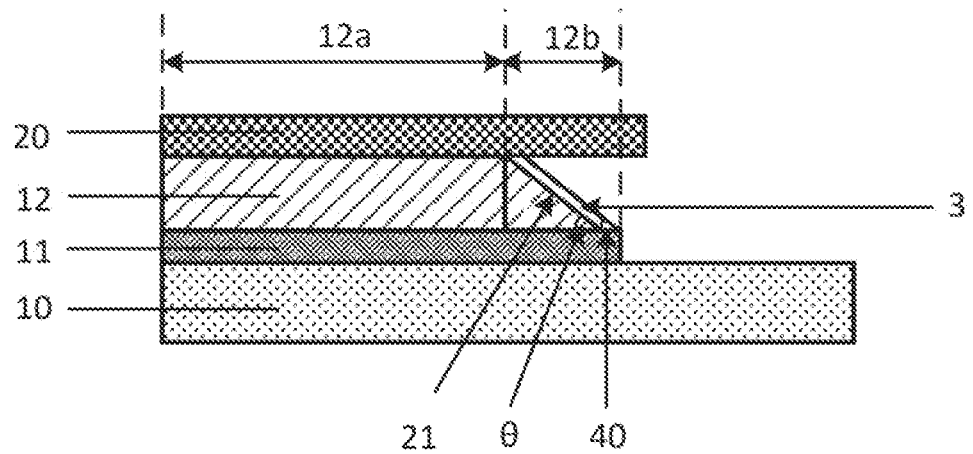

In this step, by etching, at least one extension surface 21 is formed on a surface of the edge of the gate 12 away from the first buffer layer 11, and the extension surface 21 and the surface of the first buffer layer 11 contacting the electrode 12 forms an included angle θ, as shown in FIG. 4.

The gate 12 includes at least one extension surface 21 formed on the edge of the side away from the first buffer layer 11, and a second surface 22, wherein the second surface 22 is a part of surface of the gate 12 away from the first buffer layer 11 except for the extension surface 21.

In the present embodiment, the extension surface 21 is an inclined surface, and the inclined surface is in contact with the surface of the first buffer layer 11 that contacts the gate 12 and forms the included angle θ, which is equivalent to the undercut structure as shown in FIG. 1. A magnitude of the included angle θ of the extension surface 21 can be obtained by controlling an exposure amount of the photoresist layer 20 at different positions and using an etching agent to perform partial etching to reduce a thickness of the photoresist layer. In some embodiments, the obtained included angle θ generally ranges from 30 degrees to 75 degrees.

Step S03: forming an anti-reflection layer 13 on a surface of the electrode 12 before peeling off the photoresist layer 20.

The step of forming the anti-reflection layer 13 on the surface of the gate 12 further includes the step S31: oxidizing an exposed surface of the electrode 12 with extreme ultraviolet in an oxidizing gas environment to form the anti-reflection layer 13.

In this step, an extreme ultraviolet sealed environment filled with oxidizing gas is provided, and extreme ultraviolet (EUV) is configured to irradiate the exposed surface of the gate 12, that is, the extension surface 21 is oxidized by exciting the oxidizing gas to obtain the first anti-reflection layer 13. The first anti-reflection layer 13 is an oxide of material of the gate 12, and material of the first anti-reflection layer 13 is a metal oxide layer. In this step, the oxidizing gas can be oxygen or ozone.

It should be further explained that, in this step, the first anti-reflection layer 13 is formed on the extension surface 21 and covers the extension surface 21, and the first anti-reflection layer 13 is in contact with the first buffer layer 11. The outer surface of the first anti-reflection layer 13 away from the extension surface 21 and the surface of the first buffer layer 11 contacting the first electrode 12 form an undercut structure 40 as shown in FIG. 4.

It should be noted that this step is completed before the subsequent step of peeling off the photoresist layer 20, and the photoresist layer 20 is configured to prevent a possibility that a metal surface of the second surface 22 is simultaneously oxidized.

In this step, the material of the first anti-reflection layer 13 is an oxide of the material of the gate 12. The first anti-reflection layer 13 is a metal oxide layer. Wherein, when the material of the gate 12 is copper, the material of the first anti-reflection layer 13 is black copper oxide. When the material of the gate 12 is silver, the material of the first anti-reflection layer 13 is silver oxide, and the first anti-reflection layer 13 is configured to reduce a light reflection.

Figure 5:
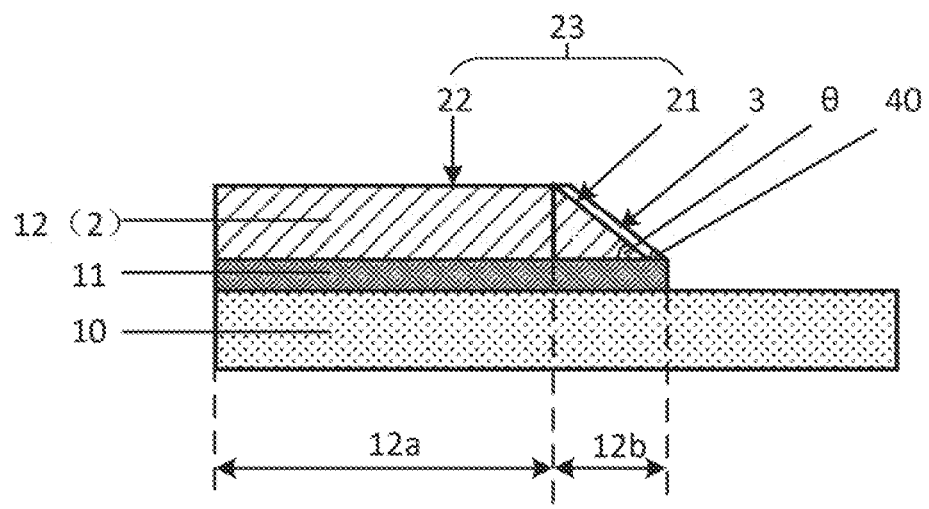

In this step, it further includes step S32: peeling off the photoresist layer 20, as shown in FIG. 5.

Figure 6:
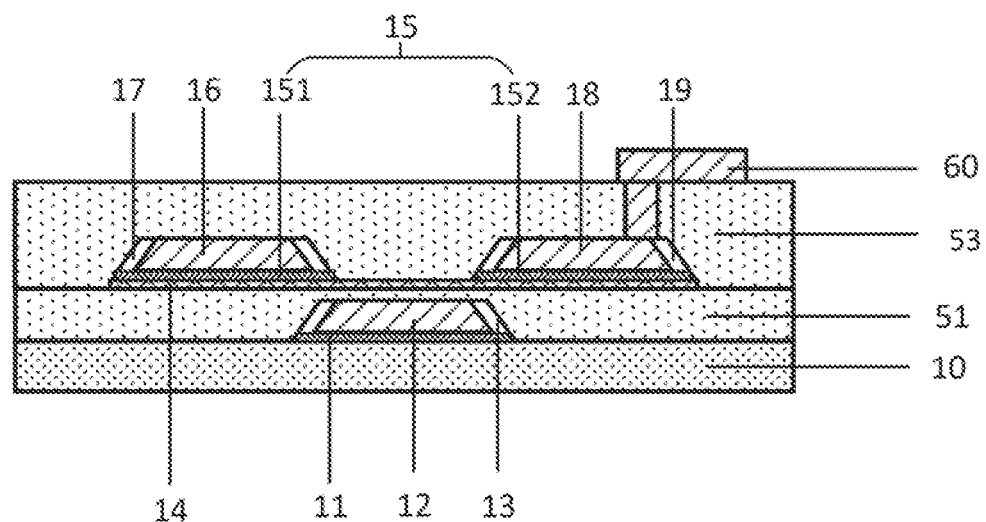

Step S04: then, sequentially forming a gate insulating layer 51, an active layer 14, a second buffer layer 15, a source 16, a second anti-reflection layer 17, a drain 18, a third anti-reflection layer 19, a passivation layer 53, and a pixel electrode 60, as shown in FIG. 6.

In this step, the gate insulating layer 51 is formed on the gate 12 and the first anti-reflection layer 13, and covers the gate 12, the first anti-reflection layer 13, the first buffer layer 11, and the substrate 10. In some embodiments, the gate insulating layer 51 can include silicon oxide, silicon nitride, silicon oxynitride, and/or similar materials. These can be used alone or in combination.

In this step, the active layer 14 is formed on the gate 12 and a side of the first anti-reflection layer 13 away from the substrate 10. In some embodiments, the active layer 14 includes any one of an oxide semiconductor and a low-temperature polysilicon semiconductor.

In this step, a manufacturing method of the second buffer layer 15, the source 16, the second anti-reflection layer 17, the drain 18, and the third anti-reflection layer 19 is same as a manufacturing method of the first electrode 12. Specifically, the second buffer layer 15 is formed on the active layer 14, and the second buffer layer 15 includes the first portion 151 and the second portion 152 that are disconnected from each other. The source 16 and the second anti-reflection layer 17 are formed on the first portion 151 of the second buffer layer 15, and the second anti-reflection layer 17 is disposed surrounding an edge of the source 16 and covering the edge of the source, and extends to be in contact with the second buffer layer 15. The drain 18 and the third anti-reflection layer 19 are formed on the second portion 152 of the second buffer layer 15, and the third anti-reflection layer 18 is disposed surrounding an edge of the drain 18 and covering the edge of the drain, and extends to be in contact with the second buffer layer 15.

In the present embodiment, material of the first portion 151 and the second portion 152 of the second buffer layer 15 is same as or different from material of the first buffer layer 11, both of which are black metal for shading. The material of the second buffer layer 15 is preferably molybdenum oxide.

In the present embodiment, material of the source 16 and the drain 18 is same as or different from material of the gate 12, and both are metal electrodes. The material of the source 16 and the drain 18 is preferably copper or silver.

In the present embodiment, the material of the second anti-reflection layer 17 is a metal oxide of the source 16, and the material of the third anti-reflection layer 19 is a metal oxide of the drain 18. The second anti-reflection layer 17 is preferably made of copper oxide or silver oxide, and the third anti-reflection layer 19 is preferably made of copper oxide or silver oxide. The copper oxide or the silver oxide film layer has an obvious anti-reflective effect. In the present embodiment, the first anti-reflection layer 13, the second anti-reflection layer 17, and the third anti-reflection layer 19 are all equivalent to the anti-reflection layer 3 shown in FIG. 1, which are configured to realize an effect of reducing reflection.

In this step, the passivation layer 53 is formed on the source 16 and the drain 18, and covers the source 16, the second anti-reflection layer 17, the drain 18, the third anti-reflection layer 19, the second buffer layer 15, the active layer 14, and the gate insulating layer 51. A via hole is formed on the passivation layer 53, and the via hole penetrates the passivation layer 53. In some embodiments, the passivation layer 53 can include silicon oxide, silicon nitride, silicon oxynitride, and/or similar materials. These can be used alone or in combination.

In this step, the pixel electrode 60 is formed on a surface of the passivation layer 53 away from the substrate 10, and a part of the pixel electrode is electrically connected to either the source 16 or the drain 18 passing through the via hole of the passivation layer 53. In some embodiments, material of the pixel electrode 60 is at least one of indium tin oxide or indium zinc oxide.

For the specific implementation of each of the above operations, refer to the previous embodiments, which will not be repeated here.

In summary, the present application directly provides at least one electrode 2 and at least one anti-reflection layer 3 on the buffer layer 1. The anti-reflection layer 3 is disposed surrounding the edge of the electrode 2 and covering the edge of the electrode, and the anti-reflection layer 3 extends to be in contact with the buffer layer 1. The undercut structure 40 is formed between the outer surface of the anti-reflection layer 3 away from the electrode 2 and the surface of the buffer layer 1 contacting the electrode 2. The present application further provides a specific embodiment, by providing at least one extension surface 21 formed on the surface of the edge of the electrode 2 away from the first buffer layer 1, the extension surface 21 and the surface of the buffer layer 1 contacting the electrode 2 form the included angle θ. The anti-reflection layer 3 is disposed on the extension surface 21 and covers the extension surface 21, and the material of the anti-reflection layer 3 is metal oxide. In products with a thin film transistor side facing outwardly, the anti-reflection layer is configured to reduce a reflectivity and to eliminate a problem of light leakage of the products with the thin film transistor side facing outwardly in a dark state.

It can be understood that, for those of ordinary skill in the art, equivalent replacements or changes can be made according to the technical solution of the present application and its inventive concept, and all these changes or replacements shall fall within the protection scope of the appended claims of the present application.

What is claimed is:

1. An electrode structure, comprising:
    at least one buffer layer disposed on a substrate;
    at least one electrode disposed on a surface of the buffer layer away from the substrate, an edge of the electrode comprising at least one extension surface extending from a surface of the electrode away from the substrate, wherein the extension surface is in contact with a surface of the buffer layer contacting the electrode and forms an included angle with the surface of the buffer layer contacting the electrode;

an anti-reflection layer disposed at the edge of the electrode, wherein the anti-reflection layer is configured to surround and cover the edge of the electrode, and the anti-reflection layer extends to be in contact with the buffer layer; and, an undercut structure formed between an outer surface of the anti-reflection layer away from the electrode and the surface of the buffer layer contacting the electrode;

wherein the anti-reflection layer is configured to cover the extension surface, and an outer surface of the anti-reflection layer away from the extension surface and the surface of the buffer layer contacting the electrode are configured to form the undercut structure; and wherein the electrode further has a continuous first surface, the first surface further comprises the extension surface and a second surface, the second surface is a surface excluding the extension surface, the anti-reflection layer is configured to cover only the extension surface and not cover the second surface.

2. The electrode structure according to claim 1, wherein a cross-sectional area of the electrode away from the substrate is less than or equal to a cross-sectional area of the electrode close to the substrate in a direction perpendicular to the substrate.

3. The electrode structure according to claim 1, wherein a material of the anti-reflection layer is metal oxide.

4. The electrode structure according to claim 1, wherein a material of the anti-reflection layer is an oxide of material of the electrode.

5. The electrode structure according to claim 4, wherein a material of the buffer layer is molybdenum oxide.

6. electrode structure according to claim 1, wherein a material of the electrode is copper or silver, and a material of the anti-reflection layer is copper oxide or silver oxide.

7. A thin film transistor comprising an electrode structure, wherein the electrode structure comprises:

at least one buffer layer disposed on a substrate;

at least one electrode disposed on a surface of the buffer layer away from the substrate;

an anti-reflection layer disposed at an edge of the electrode, wherein the anti-reflection layer is configured to surround and cover the edge of the electrode, and the anti-reflection layer extends to be in contact with the buffer layer; and an undercut structure formed between an outer surface of the anti-reflection layer away from the electrode and a surface of the buffer layer contacting the electrode;

wherein the electrode further has a continuous first surface, the first surface further comprises the extension surface and a second surface, the second surface is a surface excluding the extension surface, the anti-reflection layer is configured to cover only the extension surface and not cover the second surface.

8. The thin film transistor according to claim 7, wherein the edge of the electrode comprises at least one extension surface extending from a surface of the electrode away from the substrate, and the extension surface is in contact with the surface of the buffer layer contacting the electrode and forms an included angle with the surface of the buffer layer contacting the electrode.

9. The thin film transistor according to claim 8, wherein a cross-sectional area of the electrode away from the substrate is less than or equal to a cross-sectional area of the electrode close to the substrate in a direction perpendicular to the substrate.

10. The thin film transistor according to claim 8, wherein the anti-reflection layer is configured to cover the extension surface, and an outer surface of the anti-reflection layer away from the extension surface and the surface of the buffer layer contacting the electrode are configured to form the undercut structure.

11. The thin film transistor according to claim 7, wherein a material of the anti-reflection layer is a metal oxide.

12. The thin film transistor according to claim 7, wherein a material of the anti-reflection layer is an oxide of material of the electrode.

13. The thin film transistor according to claim 12, wherein a material of the buffer layer is molybdenum oxide.

14. The thin film transistor according to claim 7, wherein a material of the electrode is copper or silver, and a material of the anti-reflection layer is copper oxide or silver oxide.

15. A manufacturing method of an electrode structure, comprising following steps:

forming a buffer layer and a metal layer stacked on a substrate sequentially;

forming a photoresist layer on the metal layer, and patterning the buffer layer and the metal layer to obtain a patterned buffer layer and an electrode; and forming an anti-reflection layer on a surface of the electrode before peeling off the photoresist layer.

16. The manufacturing method of the electrode structure according to claim 15, wherein the step of forming the anti-reflection layer on the surface of the electrode comprises:

oxidizing an exposed surface of the electrode with extreme ultraviolet in an oxidizing gas environment to form the anti-reflection layer.

* * * * *